(12) United States Patent
Ellis

(10) Patent No.: US 11,513,341 B2
(45) Date of Patent: Nov. 29, 2022

(54) MICROELECTROMECHANICAL (MEMS) SCANNERS FOR SCANNING LASER DEVICES

(71) Applicant: Microvision, Inc., Redmond, WA (US)

(72) Inventor: Matthew Ellis, Sammamish, WA (US)

(73) Assignee: Microvision, Inc., Redmond, WA (US)

( * ) Notice: Subject to any disclaimer, the term of this patent is extended or adjusted under 35 U.S.C. 154(b) by 791 days.

(21) Appl. No.: 16/511,546

(22) Filed: Jul. 15, 2019

(65) Prior Publication Data

US 2021/0018746 A1 Jan. 21, 2021

(51) Int. Cl.
*G02B 26/08* (2006.01)
*G02B 26/10* (2006.01)
*H02N 2/02* (2006.01)
*H01L 41/187* (2006.01)

(52) U.S. Cl.
CPC ......... *G02B 26/0858* (2013.01); *G02B 26/10* (2013.01); *G02B 26/101* (2013.01); *H02N 2/028* (2013.01); *H01L 41/1875* (2013.01); *H01L 41/1876* (2013.01)

(58) Field of Classification Search
CPC .. G02B 26/0858; G02B 26/10; G02B 26/101; H02N 2/028; H01L 41/1875; H01L 41/1876
See application file for complete search history.

(56) References Cited

U.S. PATENT DOCUMENTS

2004/0007069 A1* 1/2004 Turner ............... G02B 26/0841 73/580

FOREIGN PATENT DOCUMENTS

| JP | 2006293116 A | * | 10/2006 | ........... G02B 26/085 |
| JP | 2009094139 A | * | 4/2009 | ........... B41J 2/14233 |
| JP | 2013003523 A | * | 1/2013 | ............. G02B 26/10 |
| JP | 2017161561 A | * | 9/2017 | ............. G02B 26/10 |

OTHER PUBLICATIONS

Baran, et al., "Resonant PZT MEMS Scanner for High-Resolution Displays", Journal of Microelectromechanical Systems, vol. 21, No. 6, pp. 1303-1310, Dec. 1, 2012, 1303-1310.
Chen, et al., "A Novel To-Axis MEMS Scanning Mirror with a PZT Actuator for Laser Scanning Projection", Optics Express, vol. 20, No. 24, Nov. 19, 2012.
Koh, et al., "A 2-D Mems Scanning Mirror Using Piezoelectric PZT Beam Actuators", Procedia Chemistry 1, (2009), Jan. 1, 2009, 13-03-1306.
Tani, et al., "A Combination of Fast Resonant Mode and Slow Static Deflection of SOI-PZT Actuators for MEMS Image Projection Display", IEEE/LEOS International Conference Optical MEMS Application, Big Sky, MT, USA, pp. 25-26, Aug. 1, 2006, 25-26.

* cited by examiner

*Primary Examiner* — Yaovi M Ameh
(74) *Attorney, Agent, or Firm* — Kevin D. Wills

(57) ABSTRACT

The embodiments described herein include scanners that can provide improved scanning laser devices. Specifically, the embodiments described herein provide scanners with a modular construction that includes one or more separately formed piezoelectric actuators coupled to a microelectromechanical system (MEMS) scan plate, flexure structures, and scanner frame. Such modular scanners can provide improved scanning laser devices, including scanning laser projectors and laser depth scanners, LIDAR systems, 3D motion sensing devices, gesture recognition devices, etc.

17 Claims, 8 Drawing Sheets

MICROELECTROMECHANICAL (MEMS) SCANNERS FOR SCANNING LASER DEVICES

FIELD

The present disclosure generally relates to scanners, and more particularly relates to scanners used in scanning laser devices.

BACKGROUND

In scanning laser devices, laser light is reflected off one or more scanners to generate a scanning pattern. For example, in scanning laser projectors, images are projected by scanning laser light into a pattern with a scanning mirror, with individual pixels generated by modulating the laser light. Similarly, laser depth scanners generate depth maps by scanning laser light into a pattern with a scanning mirror and measuring the laser light reflected back.

High performance laser scanning devices typically require scanners that have relatively low distortion in the scanning surface, relatively large scanning angles, and sufficient scanning frequency. Additionally, it can be desirable for scanners to have relatively low power requirements and relatively low cost to manufacture.

For example, as a scanning surface rotates forces are applied to the scanning mirror and these forces can cause distortions in the mirror surface. Furthermore, as mirror rotation angles and/or speed have increased in modern devices the forces applied to the mirror have also increased. These increased forces can result in increased distortions in the mirror surface. As another example, some scanning mirror designs require complex structures and shapes. Unfortunately, such designs can lead to increased manufacturing complexity, which can reduce yield and increase device costs.

Thus, there remains a continuing need for scanners that can provide high performance with low device cost.

DESCRIPTION OF EMBODIMENTS

The embodiments described herein include scanners that can provide improved scanning laser devices. Specifically, the embodiments described herein provide scanners with a modular construction that includes one or more separately formed piezoelectric actuators coupled to a microelectromechanical system (MEMS) scan plate, flexure structures, and scanner frame. Such a modular scanner can provide improved device flexibility, reduced distortion in the mirror surface, reduced manufacturing complexity, and/or reduced device size. Thus, such modular scanners can provide improved scanning laser devices, including scanning laser projectors and laser depth scanners, LIDAR systems, 3D motion sensing devices, gesture recognition devices, etc. Examples of such scanning laser projectors include traditional image projectors, head-up displays (HUD), and helmet mounted displays (HMD).

In general, the modular scanner includes a scan plate, flexure structures, and a scanner frame that are formed separately from the piezoelectric actuator. Specifically, the scan plate, flexure structures and scanner frame are all formed from a unitary microelectromechanical (MEMS) semiconductor substrate. In general, the scanner frame surrounds the scan plate and flexure structures, with the flexure structures facilitating motion of the scan plate (e.g., rotation). The at least one piezoelectric actuator is configured to generate this motion of the scan plate in response to suitable drive signal. The resulting motion of the scan plate can be thus be controlled to reflect laser light into a pattern of scan lines, and thus can facilitate laser scanning.

In accordance with the embodiments described herein, the at least one piezoelectric actuator is separately formed and attached to the scanner frame. This facilitates the use of piezoelectric actuators that are formed from bulk materials, which can provide stronger actuation and improved device performance. Furthermore, this separate forming of the piezoelectric actuator can facilitate the use of a thicker scan plate and frame, which can reduce distortions and again increase performance. Finally, this separate forming of the piezoelectric electric actuator allows the scan plate, flexure structures and scanner frame to all be formed from a unitary MEMS semiconductor substrate, and this can reduce device complexity and cost.

Figure 1:
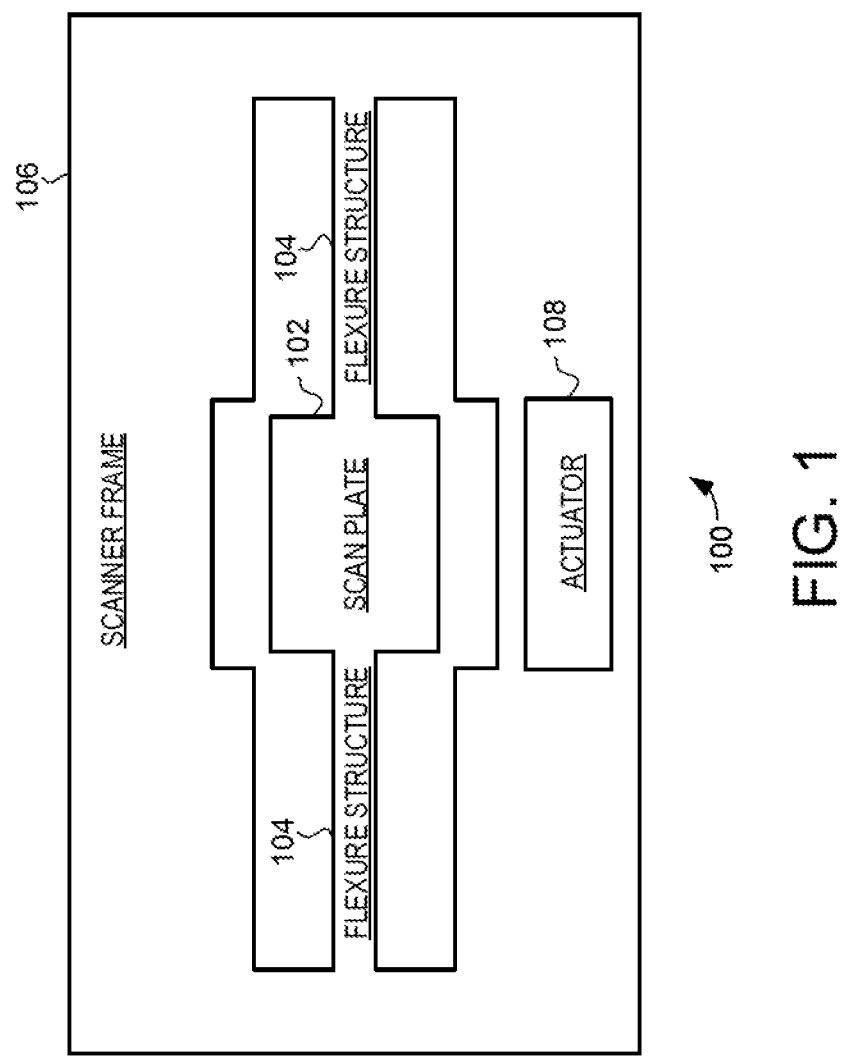
FIG. 1 shows a schematic diagram of scanner in accordance with various embodiments of the present invention.

Turning now to FIG. 1, an exemplary scanner 100 is illustrated schematically. The scanner 100 includes a scan plate 102, at least one flexure structure 104, a scanner frame 106, and at least one piezoelectric actuator 108. In general, the scan plate 102, flexure structures 104, and scanner frame 106 are formed separately from the piezoelectric actuator 108. Specifically, the scan plate 102, flexure structures 104 and scanner frame 106 are all formed from a unitary microelectromechanical (MEMS) semiconductor substrate. Thus, the scanner frame 106 surrounds and is unitary with the scan plate 102 and the flexure structures 104. During operation, the flexure structures 104 facilitate motion of the scan plate 102. In one embodiment, these flexure structures 104 comprise torsion arms that facilitate rotation of the scan plate 102 by twisting. In other embodiments, these flexure structures 104 comprise bending arms or bending beams that facilitate rotation of the scan plate 102 by bending.

The at least one piezoelectric actuator 108 is configured to generate this motion of the scan plate 102 in response to suitable drive signal(s). The motion of the scan plate 102 can thus be controlled by the drive signal(s), and with this controlled motion the scanner 100 can implemented to reflect laser light into a pattern of scan lines, and thus can facilitate laser scanning.

In accordance with the embodiments described herein, the at least one piezoelectric actuator 108 is separately formed and attached to the scanner frame 106. This facilitates the use of piezoelectric actuators 108 that are formed from bulk piezoelectric materials. Piezoelectric actuators 108 that are formed from such bulk materials can provide a stronger actuation compared to thin film actuators. This stronger actuation can facilitate improved performance of the scanner 100. Furthermore, this use of a piezoelectric actuator 108 that provides stronger actuation can facilitate the use of a thicker scan plate 102 and scanner frame 106 in the scanner 100. The use of such a thicker scan plate 102 and scanner frame 106 can reduce distortions and thus again increase device performance. Finally, this separate forming of the piezoelectric actuator 108 allows the scan plate 102, flexure structures 104 and scanner frame 106 to all be formed from a unitary MEMS semiconductor substrate, and this can reduce device complexity and cost.

In one embodiment the at least one piezoelectric actuator 108 is attached to the scanner frame 106 with conductive adhesive. In other embodiments the at least one piezoelectric actuator 108 is attached to the scanner frame 106 with solder. In either case, the at least one piezoelectric actuator 108 is separately formed and then attached to the scanner frame 106.

In one embodiment the piezoelectric actuator 108 is formed separately from bulk materials. In such an embodiment the bulk material is separately processed using suitable techniques to form the individual separate piezoelectric actuators 108. For example, piezoelectric actuators 108 can be cut from bulk materials, shaped and suitable electrodes attached using any suitable processes.

As described above, the scan plate 102, flexure structures 104 and scanner frame 106 are all formed together from a unitary MEMS semiconductor substrate. In such a process a wafer of semiconductor material is provided and the scan plate 102, flexure structures 104 and scanner frame 106 are all formed together from the wafer. In such a process the scan plate 102, flexure structures 104 and scanner frame 106 are all formed together from the semiconductor wafer using any suitable MEMS fabrication technique, including any photolithography and micromachining techniques. As one example, in a typical embodiment, the scan plate 102, flexure structures 104 and scanner frame 106 would be photolithographically formed from a wafer of single-crystal silicon. However, use of polycrystalline silicon or combination of single and polycrystalline silicon can also be used to achieve the desired structures. In yet other embodiments, other materials such as gallium arsenide (GaAs) or silicon carbide (SiC) can be used.

In such techniques, the scan plate 102, flexure structures 104 and scanner frame 106 for multiple scanners 100 can be patterned from a single wafer using a variety of photolithographic techniques, and then the individual scanners separated and removed. These techniques can also include the deposition and patterning of metallization to form conductive traces, contacts and other such elements.

For example, the scan plate 102, flexure structures 104 and scanner frame 106 for multiple scanners 100 can be at least partially defined from the semiconductor substrate using etching. In such an embodiment this etching can be used to improve the performance of the scanner 100. For example, in some embodiments the scanner frame 106 includes one or more outer perimeter edges that are that are at least partially defined using etching. Defining at least a portion of these outer perimeter edges using etching can provide edges that are smoother than those defined using other techniques such as laser cutting or saw dicing. This increased smoothness in these outer perimeter edges can improve the ability of the scanner frame 106 to handle stress at those edges, and thus can improve the reliability of the scanner 100. In one embodiment these edges are defined by etching slots to define these outer perimeter edges.

In some embodiments, forming the scan plate 102, flexure structures 104 and scanner frame 106 from the MEMS semiconductor substrate separate from the piezoelectric actuator 108 can result in a more robust scanner 100. For example, due to the increased actuator strength provided by the separately formed piezoelectric actuator 108, the scan plate 102, flexure structures 104 and scanner frame 106 can be made to have increased thickness compared to some other devices. In one specific embodiment, the scan plate 102, flexure structures 104 and scanner frame 106 can be made to have a thickness between 350 microns and 550 microns This increased thickness can again improve the performance and reliability of scanner 100.

Specifically, the increased thickness in the scan plate 102 and the flexure structures 104 can allow for designs where the torsional stiffness of the scan plate 102 is substantially larger than the torsional stiffness of the flexure structures 104. Thus, deformation of the scanning surface on the scan plate 102 due to the forces from the flexure structures 104 is reduced. Furthermore, the increased thickness enables designs that use bulk semiconductor material instead of commonly used silicon on insulator (SOI) wafers. The internal oxide layer found in SOI wafers have less allowable stress than the pure silicon found in a bulk silicon wafer and thus limit reliability. Thus, by facilitating the use of bulk semiconductor material the increased thickness of this embodiment can improve the performance and reliability of the scanner 100.

The scan plate 102 provides the scanning surface used to reflect laser light during operation. As such, the scanning surface of the scan plate 102 can be formed to include a variety of specialized shapes, structures and/or coatings. For example, in some embodiments additional reflective or diffractive coatings can be applied to the surface of the scan plate.

For example, optical coatings can be applied to the scanning surface improve the reflectively of the surface at the wavelengths of interest, including infrared and visual color wavelengths. As another specific example, the scanning surface of the scan plate 102 can be formed with additional processing to improve or alter the axis of the planarity of the scanning surface. As another specific example, the scanning surface of the scan plate 102 can be formed with non-planar optical surface.

In other embodiments a separate mirror or other structure can formed and coupled to the scan plate 102 to provide the scanning surface. In such cases the separate mirror can include structures and/or materials that would be difficult to form with or otherwise incompatible with MEMS fabrication techniques.

As was mentioned above, the scanner 100 can be implemented in scanning laser devices, including scanning laser projectors and laser depth scanners. In such an embodiment, the scanning laser device can be implemented with a drive circuit configured to provide drive signals to one or more actuators, where the actuators generate motion in the scan plate 102 in response to the drive signals. In all cases, the resulting motion of the scan plate 102 reflects laser light into a pattern of scan lines, and thus can facilitate image projection, depth scanning, or any other suitable laser scanning function.

Figure 2A:
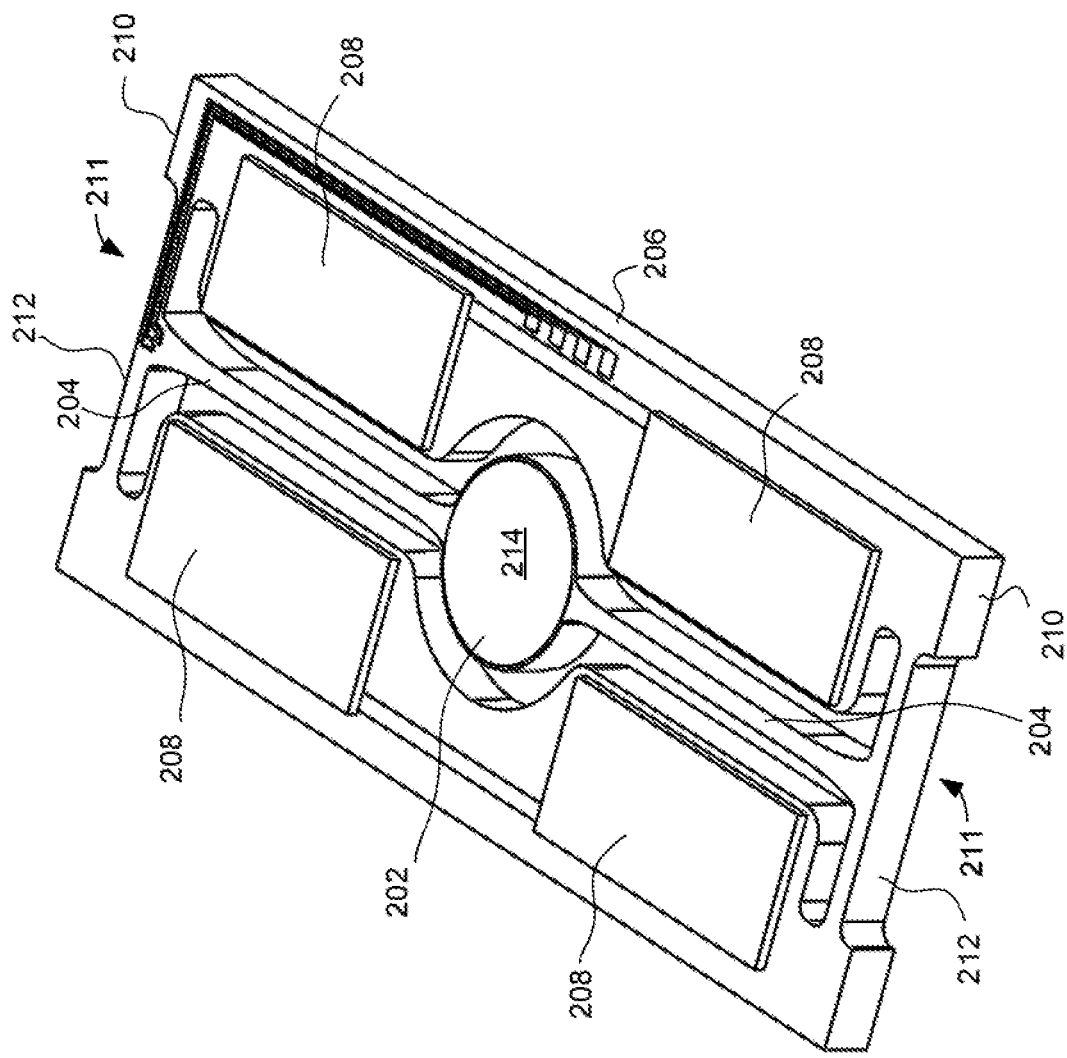
FIGS. 2A, 2B, and 2C illustrate perspective and top views of a scanner in accordance with an embodiment of the present invention.
Figure 2C:
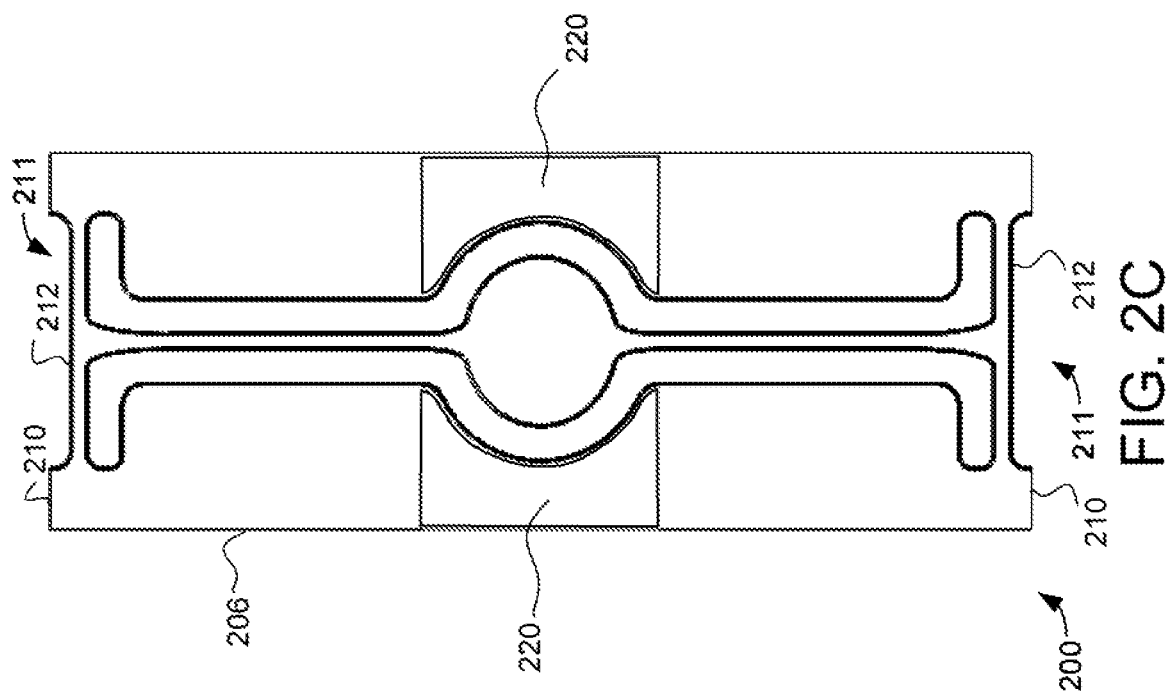
Figure 2B:
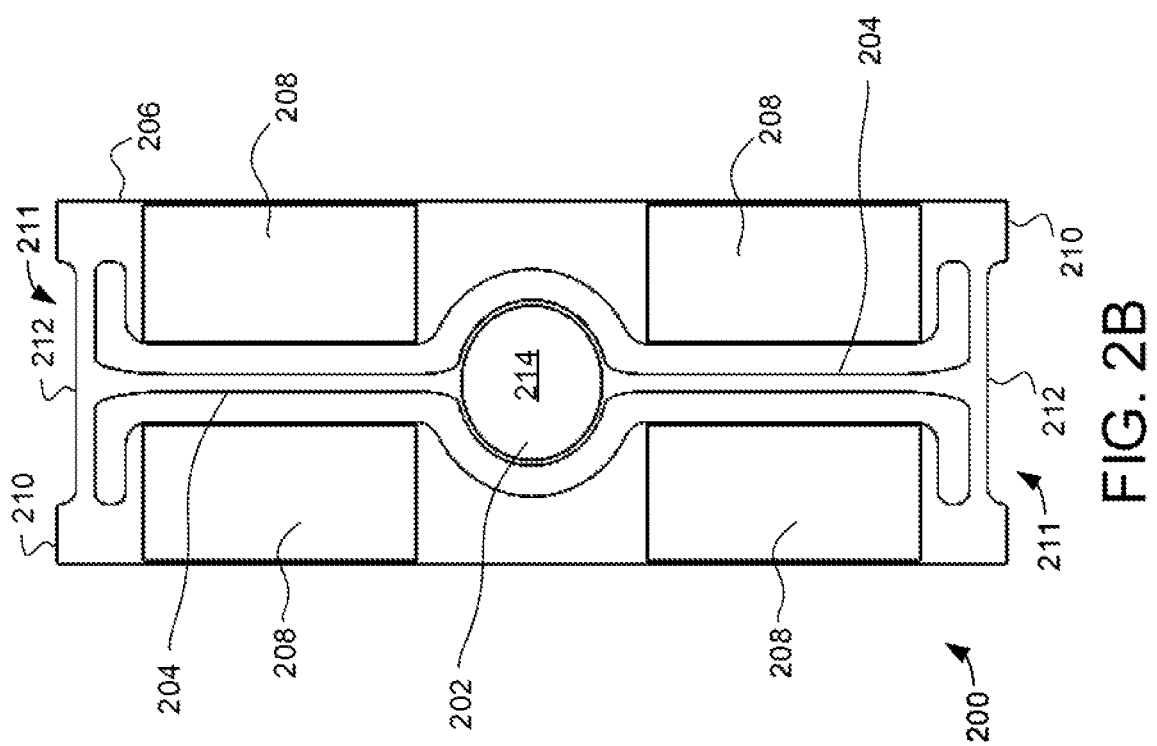

Turning now to FIGS. 2A, 2B, and 2C, a perspective view, top view and bottom view of an exemplary scanner 200 is illustrated in accordance with the embodiments described herein. The scanner 200 includes a scan plate 202, a pair of flexure structures 204, a scanner frame 206, and a plurality of piezoelectric actuators 208. Again, the scan plate 202, flexure structures 204, and scanner frame 206 are formed separately from the piezoelectric actuators 208. Specifically, the scan plate 202, flexure structures 204, and scanner frame 206 are all formed from a unitary microelectromechanical (MEMS) semiconductor substrate. Thus, the scanner frame 206 surrounds and is unitary with the scan plate 202 and the flexure structures 204. In this embodiment the scanner frame 206 includes a mounting region 220 that is extended with additional material to provide a mounting area for the scanner 200.

The flexure structures 204 facilitate motion of the scan plate 202. Specifically, in this embodiment the flexure structures 204 comprise torsion arms that facilitate rotation of the scan plate 202 by twisting. The piezoelectric actuators 208 are configured to generate this rotation of the scan plate 202 in response to suitable drive signals. The motion of the scan plate 202 can be controlled by the drive signals, and with this controlled motion the scanner 200 can implemented to reflect laser light into a pattern of scan lines, and thus can facilitate laser scanning for a variety of applications.

In accordance with the embodiments described herein, the plurality of piezoelectric actuators 208 are separately formed and then attached to the scanner frame 206. This facilitates the use of piezoelectric actuators 208 that are formed from bulk piezoelectric materials. Piezoelectric actuators 208 that are formed from such bulk materials can provide a stronger actuation compared to typical thin-film actuators. For example, the piezoelectric actuators 208 can be formed from bulk materials with a thickness between 50 and 150 microns, and this is considerably thicker than typical thin film actuators. These thicker actuators can provide stronger actuation that can facilitate improved performance of the scanner 200. Furthermore, this use of stronger piezoelectric actuators 208 can facilitate the use of a thicker scan plate 202 and scanner frame 206. The use of such a thicker scan plate 202 and scanner frame 206 can reduce distortions and thus again increase device performance. Finally, this separate forming of the piezoelectric actuators 208 allows the scan plate 202, flexure structures 204, and scanner frame 206 to all be formed from a unitary MEMS semiconductor substrate, and this can reduce device complexity and cost.

In one embodiment the plurality of piezoelectric actuators 208 are attached to the scanner frame 206 with conductive adhesive. In other embodiments the plurality of piezoelectric actuators 208 are attached to the scanner frame 206 with conductive solder. In each case the conductive nature of the attachment provides an electrical connection to the actuator.

In one embodiment the plurality of piezoelectric actuators 208 are formed separately from bulk materials, such as bulk ceramic materials. In such an embodiment the bulk material is separately processed using suitable techniques to form the individual separate piezoelectric actuators 208. For example, piezoelectric actuators 208 can be cut from bulk materials, shaped and suitable electrodes attached using any suitable processes.

For example, in one such embodiment the separately formed plurality of piezoelectric actuators 208 are formed from bulk lead zirconate titanate (PZT). In such an embodiment the bulk PZT can be formed by compressing and sintering a suitable mixture of ceramic powder. After sintering the ceramic powder becomes a polycrystalline ceramic, typically in block or sheet form. These blocks or sheets can then cut, ground and/or polished into the whatever specific shape is required for the piezoelectric actuators 108. Then, metal or other electrode material can be applied to the PZT to enable an electrical connection to the piezoelectric actuators 208. In another such embodiment the separately formed plurality of piezoelectric actuators 208 are formed from bulk lead magnesium niobate-lead titanate (PMN-PT) ceramic using similar techniques. In either case the separately formed plurality of piezoelectric actuators 108 are coupled to the scanner frame 206. And in each of these embodiments the use of separately formed piezoelectric actuators 208 formed from bulk materials can facilitate the use of the thicker and stronger actuators.

In one embodiment the separately formed plurality of piezoelectric actuators 208 are bimorph actuators. In general, bimorph actuators are actuators with two active elements stacked on top of each other. With a piezoelectric bimorph actuator, voltage applied to one active element causes the actuator to expand, while a voltage applied to the other active element causes it to contract. This controlled contraction/expansion of the active elements creates the desired bending motion in the piezoelectric actuators 208.

As described above, the scan plate 202, flexure structures 204, and scanner frame 206 are all formed together from a unitary MEMS semiconductor substrate. In a typical process a wafer of semiconductor material is provided and the scan plate 202, flexure structures 204, and scanner frame 206 for multiple scanners 200 are all formed together and then singulated into individual devices using a suitable technique (e.g., mechanical sawing or laser cutting).

In such a process the scan plate 202, flexure structures 204, and scanner frame 206 are all formed together from the semiconductor wafer using any suitable MEMS fabrication technique, including any photolithography and micromachining techniques. These techniques can also include the deposition and patterning of metallization to form conductive traces, contacts and other such elements. As one example, in a typical embodiment, the scan plate 202, flexure structures 204, and scanner frame 206 would be photolithographically formed from a wafer of single-crystal silicon. However, use of polycrystalline silicon or combination of single and polycrystalline silicon can also be used to achieve the desired structures. In yet other embodiments, other materials such as gallium arsenide (GaAs) or silicon carbide (SiC) can be used.

In the embodiment of FIGS. 2A, 2B, and 2C the scan plate 202, flexure structures 204, and scanner frame 206 for multiple scanners 200 are at least partially defined from the semiconductor substrate using etching. This etching can include any suitable etching technique, including reactive ion etching, etc.

Furthermore, in this embodiment the scanner frame 206 includes one or more outer perimeter edges 210 that are that are at least partially defined using etching. Defining at least a portion of these outer perimeter edges 210 using etching can provide edges that are smoother than those defined using other techniques such as laser cutting. This increased smoothness in these outer perimeter edges can improve the ability of the scanner frame 206 to handle stress at those edges, and thus can improve the reliability of the scanner 200.

In the embodiment of FIGS. 2A, 2B, and 2C the outer perimeter edges 210 are partially defined by etching slots 211. Specifically, the outer perimeter edges 210 are defined at least in part by etching slots 211 are located proximate to where the flexure structures 204 couple to the scanner frame 206. In this case the slots 211 are etched opposite the connection point between the flexure structures 204 and the frame 206. Again, these slots 211 provide a relative smooth surface 212 that improves the ability the frame 206 to withstand stress at those locations without failing.

Figure 3:
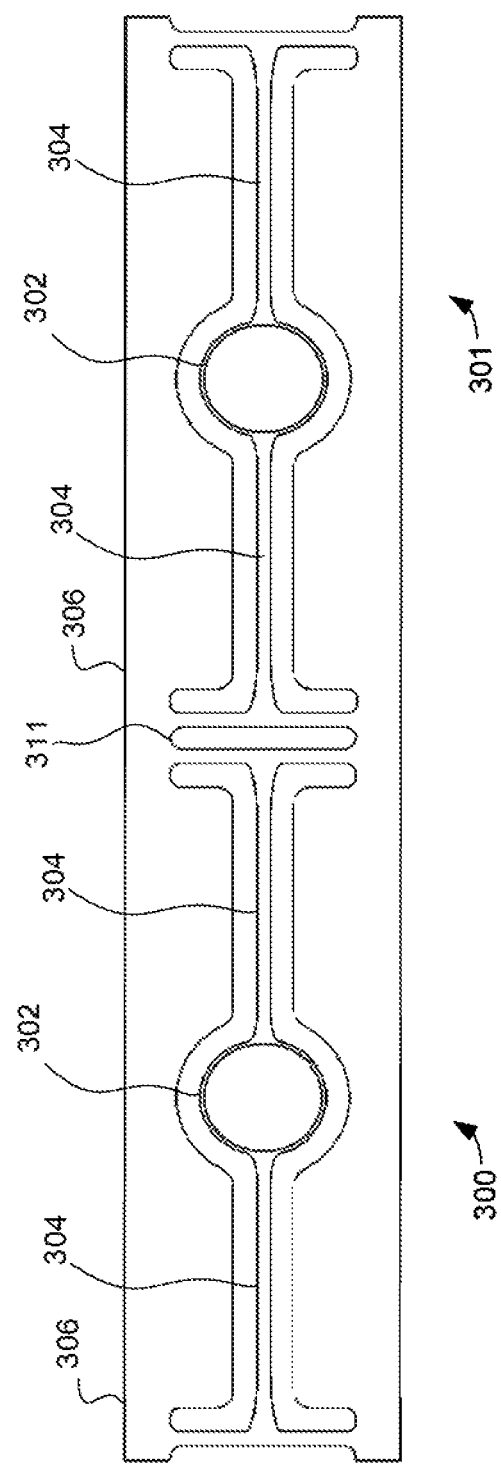
FIG. 3 illustrates a top view of a pair of scanners in accordance with an embodiment of the present invention.

Turning briefly to FIG. 3, a top view of two exemplary scanners 300 and 301 are illustrated. Each of the scanners 300, 301 includes a scan plate 302, a pair of flexure structures 304 and a scanner frame 306. Again, in this example the scan plate 302, flexure structures 304 and scanner frame 306 are formed from a unitary microelectromechanical (MEMS) semiconductor substrate. Furthermore, FIG. 3 shows the two scanners 300, 301 before they are fully diced or separated (e.g., by laser cutting between the two scanners 300, 301). And in accordance with this embodiment FIG. 3 shows the slot 311 that can be formed by etching between the frames 306 of the two scanners 300, 301. Again, when separated the slot 311 defines a portion of the outer perimeter edge of the scanner frames 306. And again, when formed by etching the slot 311 provides a relative smooth surface that improves the ability the frames 306 to withstand stress at those locations without failing.

Returning to FIGS. 2A, 2B, and 2C, thus in some embodiments forming the scan plate 202, flexure structures 204, and scanner frame 206 from the MEMS semiconductor substrate separate from the piezoelectric actuator 208 can result in a more robust scanner 200. Furthermore, due to the increased actuator strength that can be provided by the separately formed piezoelectric actuators 208, the scan plate 202, flexure structures 204, and scanner frame 206 can be made to have increased thickness compared to some other devices. In one specific embodiment, the scan plate 202, flexure structures 204, and scanner frame 206 can be made to have a thickness between 350 microns and 550 microns.

In the illustrated embodiment, the scan plate 202, flexure structures 204, and scanner frame 206 can have a relatively simple structure that facilitates ease of MEMS fabrication. Specifically, in some embodiments the scan plate 202, flexure structures 204, and scanner frame 206 can be formed to have a substantially uniform, planar top surface. Furthermore, the top surface and the bottom surface are parallel in this illustrated embodiment. Such a relatively simple structure can be reliably formed with a minimum of traditional MEMS fabrication techniques, and thus improve manufacturing yield and/or reduce manufacturing cost.

The scan plate 202 provides the scanning surface 214 used to reflect laser light during operation. As such, the scanning surface 214 of the scan plate 202 can be formed to include a variety of specialized shapes, structures and/or coatings. For example, in some embodiments additional reflective or diffractive coatings can be applied to the scanning surface 214 of the scan plate 202.

For example, optical coatings can be applied to the scanning surface 214 improve the reflectively of the surface at the wavelengths of interest, including infrared and visual color wavelengths. As another specific example, the scanning surface 214 of the scan plate 202 can be formed with additional processing to improve or alter the axis of the planarity of the scanning surface 214. As another specific example, the scanning surface 214 of the scan plate 202 can be formed with a non-planar optical surface.

In other embodiments a separate mirror or other structure can formed and coupled to the scan plate 202 to provide the scanning surface 214. In such cases the separate mirror can include structures and/or materials that would be difficult to form with or otherwise incompatible with MEMS fabrication techniques. Examples of such techniques can be found in U.S. Pat. No. 10,209,510, entitled "Compact Modular Scanners for Scanning Laser Devices" and assigned to Microvision, Inc.

As was mentioned above, the scanner 200 can be implemented in scanning laser devices, including scanning laser projectors and laser depth scanners. In such an embodiment, the scanning laser device can be implemented with a drive circuit configured to provide drive signals to the plurality of actuators 208, where the actuators 208 generate motion in the scan plate 202 in response to the drive signals. In making such an implementation, any suitable drive signal technique can be used. The resulting motion of the scan plate 202 reflects laser light into a pattern of scan lines, and thus can facilitate image projection, depth scanning, or any other suitable laser scanning function.

Specifically, during operation of the scanner the piezoelectric actuators 108 selectively contract and expand in response to suitable drive signals. More specifically, in a typical embodiment the piezoelectric actuators 108 on one side are driven by the drive signals to contract while the piezoelectric actuators 108 on the other side are driven to expand. The contracting piezoelectric actuators 108 cause the proximate corners of the scanner frame 206 to bend upward, while the expanding piezoelectric actuators 108 cause the proximate corners to bend downward. Thus, by simultaneously contracting two piezoelectric actuators 108 on one side and expanding the other two piezoelectric actuators 108 on the other side scan plate 202 can be made to rotate. And by applying such signals in an alternating manner and at an appropriate resonant frequency the scan plate 202 can be made to rotate back and forth and reflect the laser beam in the desired pattern.

In one specific embodiment that will be described in greater detail below, the scanner 200 is implemented in a scanning laser device that uses two mirrors for laser scanning. In such a device, a first scanner 200 can be configured to deflect along one axis and a second scanner 200 configured to deflect along a second axis that is largely perpendicular to the first axis. Furthermore, in such a device the first scanner 200 can be used for relatively fast scan motion, while the second scanner 200 is used for relatively slow scan motion. In one specific embodiment, the relatively fast scan motion comprises resonant sinusoidal motion while the relatively slow scan motion comprises non-resonant or quazistatic controlled motion.

One issue with relatively fast scan motion is the resulting increase in strain and other forces on the scanning surface. Because scanner 200 is highly resistant to distortion in the scanning surface, the scanner 200 is particularly well adapted to providing fast scan motion. Again, examples of such an implementation will be described in greater detail below.

Figure 4A:
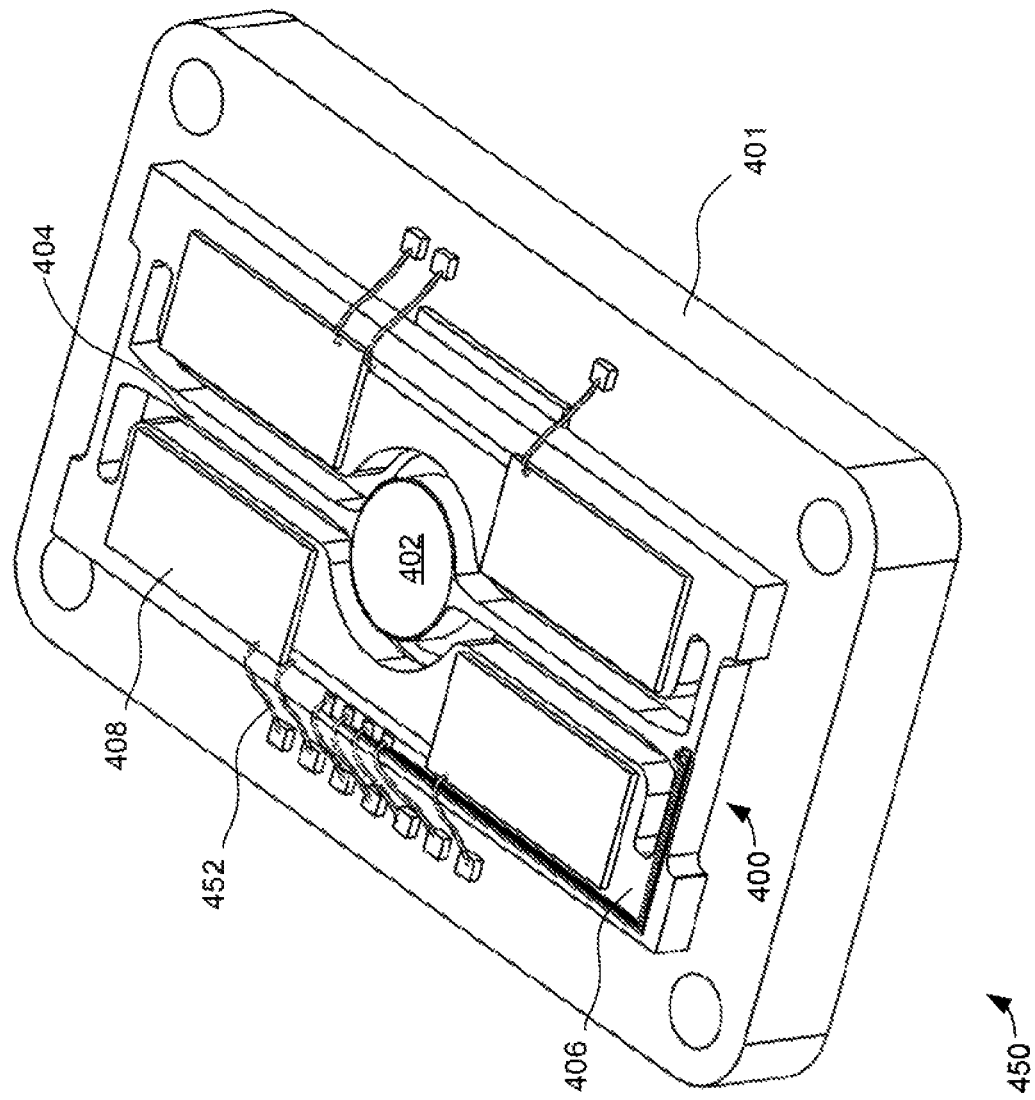
FIGS. 4A and 4B illustrate perspective and exploded views of a scanner assembly in accordance with an embodiment of the present invention.
Figure 4B:
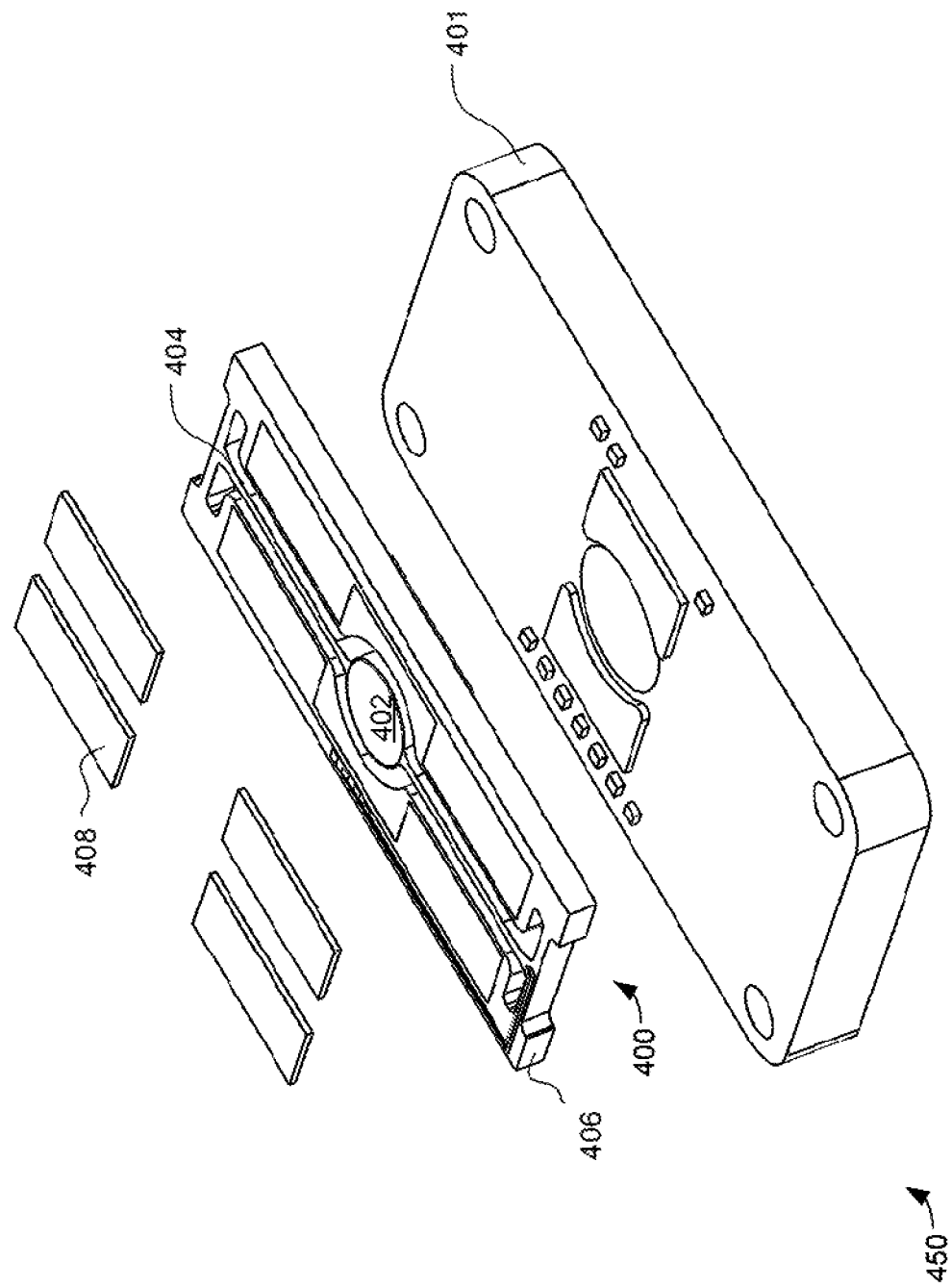

Turning now to FIGS. 4A and 4B, a perspective and exploded view of a scanner assembly 450 that includes a scanner 400 mounted to carrier 401 is illustrated. In accordance with the embodiments described herein, the scanner 400 includes a scan plate 402, a pair of torsion arms 404, a scanner frame 406, and a plurality of piezoelectric actuators 408. As shown in FIG. 4A, the scanner 400 is mounted to the carrier 401 and electrical connections between the scanner 400 and the carrier 401 are provided by a plurality of leads 452. Specifically, the leads provide connections to the plurality of piezoelectric actuators 408 and one or more sensors. So configured the scanner assembly 450 can be implemented into a scanning laser device.

The scanners 100, 200, 300, 301 and 400 described above can be implemented in variety of scanning laser devices, including scanning laser projectors and laser depth scanners. For example, the scanners can be implemented as part of a scanning laser device to provide relatively fast, resonant motion, while a relatively slow scan motion is provided by another mirror.

Figure 5:
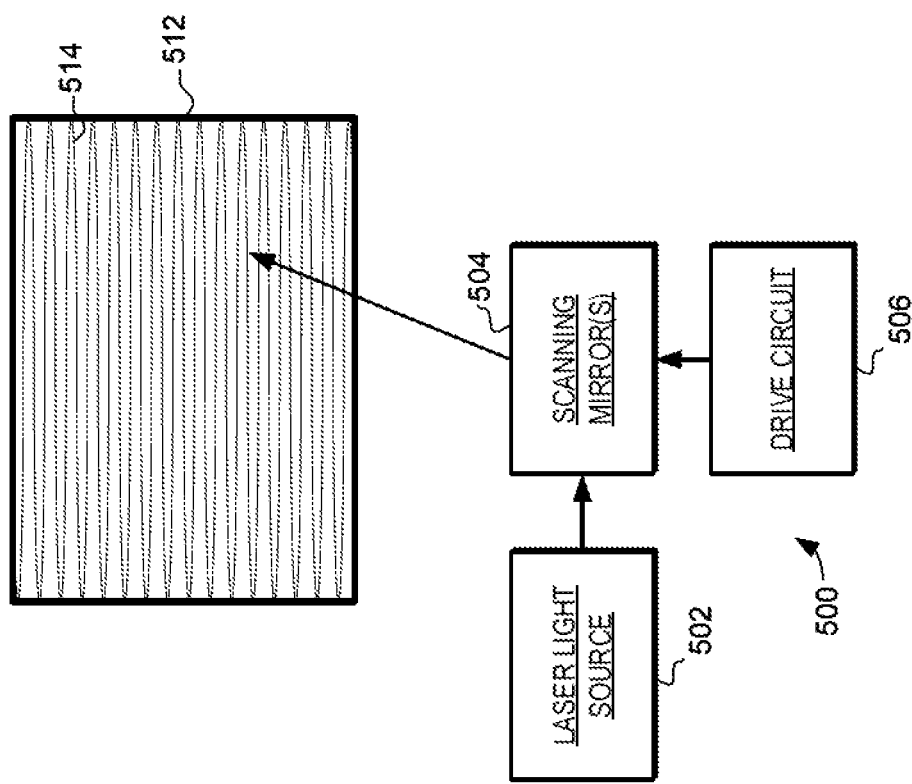
FIG. 5 shows a schematic view of a scanning laser device in accordance with various embodiments of the present invention.

Turning now to FIG. 5, a schematic diagram of a scanning laser device 500 is illustrated. The scanning laser device 500 includes a laser light source 502, scanning mirror(s) 504 and a drive circuit 506. In accordance with the embodiments described herein, one or more the scanning mirror(s) 504 can be implemented with any of the scanners described above (e.g., scanners 100, 200, 300, 301, and 400). Such a scanning laser device 500 can be implemented to perform a variety of functions. For example, the scanning laser device 500 can be implemented to facilitate image projection, laser depth scanning, LIDAR, 3D motion sensing, gesture recognition, etc.

During operation, the laser light source 502 generates at least one beam of laser light that is reflected by the scanning mirror(s) 504 into a pattern 514 of scan lines inside a scanning region 512. In the example of FIG. 4, the pattern 514 of scan lines comprises a raster pattern. However, this is just one example, and in other embodiments other patterns of scan lines can be generated as used. For example, spiral patterns and Lissajous patterns could instead be implemented.

To facilitate this, the drive circuit 506 controls the movement of the scanning mirror(s) 504. Specifically, the drive circuit 506 provides excitation signal(s) to excite motion of the scanning mirror(s) 504.

As one example, in a device implemented to provide image projection, the beam of laser light would be encoded with pixel data to generate image pixels. In another example, the laser light source 502 can include an infrared or other suitable laser that is used to generate the depth mapping pulses. Reflections of these pulses from a surface can then be received and used to generate 3-dimensional maps of the surface. For example, the depth map of the surface can be determined by calculating a time of flight for the return of each received depth mapping pulse.

Figure 6:
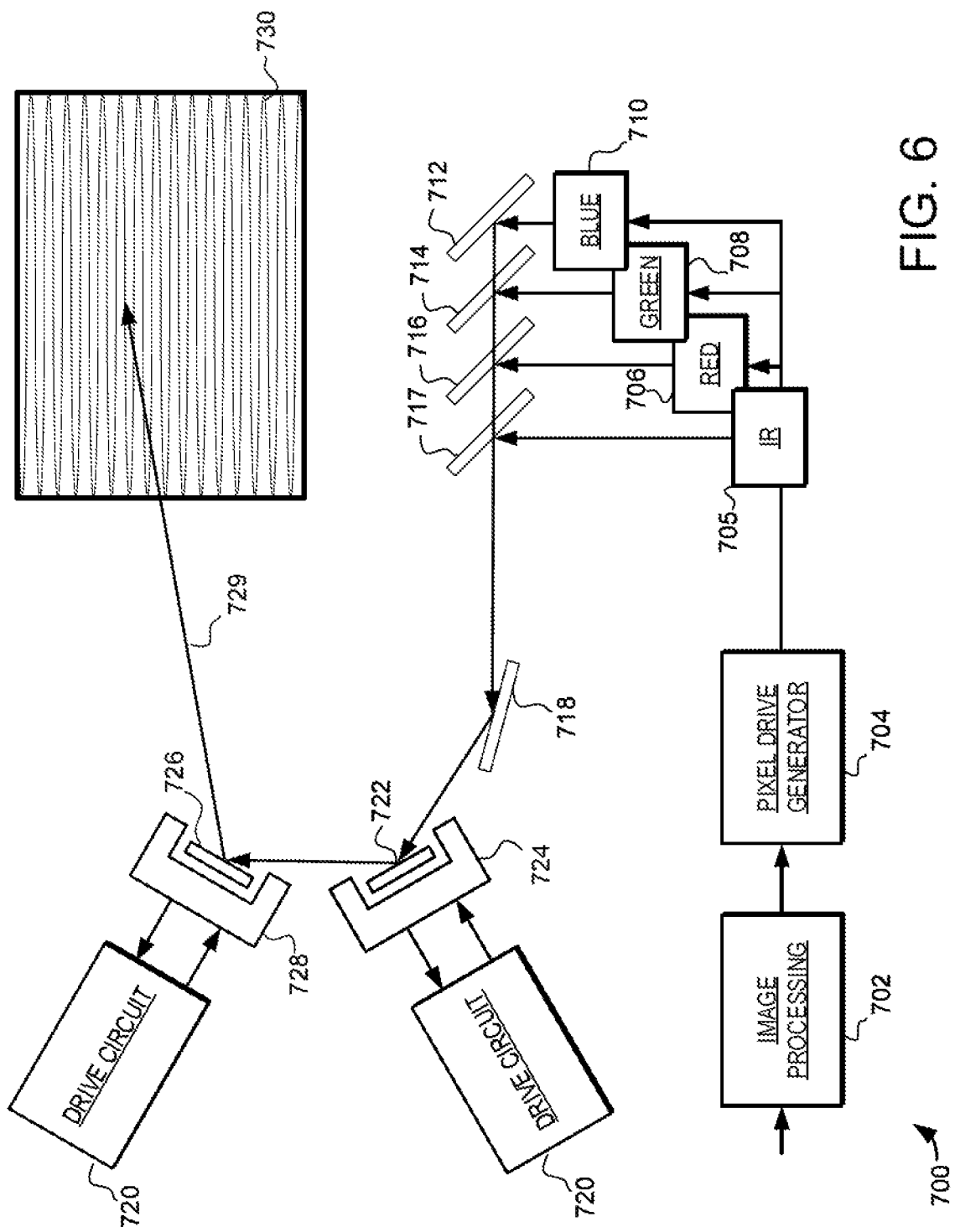
FIG. 6 shows a schematic view of a scanning laser projector in accordance with various embodiments of the present invention.

Turning now to FIG. 6, a schematic view of a scanning laser projector 700 is illustrated. The scanning laser projector 700 is a more detailed example of the type of system that can be used in accordance with various embodiments of the present invention. Specifically, the scanning laser projector 700 can be implemented using the various scanners described above. In some embodiments, the scanning laser projector is implemented to provide both laser depth scanning and laser image projection, while in other embodiments, only image projection is provided.

Scanning laser projector 700 includes an image processing component 702, a pixel drive generator 704, an infrared laser module 705, a red laser module 706, a green laser module 708, and a blue laser module 710. In such an embodiment, the red, green and blue light can be used for image projection, while the infrared light can be used for depth scanning. Light from the laser modules is combined with dichroics 712, 714, 716, and 717. Scanning laser projector 700 also includes fold mirror 718, drive circuits 720, a first scanner assembly 724 and second scanner assembly 728. The first scanner assembly 724 includes a first scanner 722 and the second scanner assembly 728 includes a second scanner 726. It should be noted that this illustrated arrangement for combing the outputs from the various laser modules is just one example implementation, and other implementations using different techniques for combing laser light of different wavelengths can instead be used.

In operation, image processing component 702 processes video content using two-dimensional interpolation algorithms to determine the appropriate spatial image content for each scan position at which an output pixel is to be displayed by the pixel drive generator 704. For example, the video content may represent a grid of pixels at any resolution (e.g., 640×480, 848×480, 1280×720, and 1920×1080). The input light intensity encoding typically represents the light intensity in 8, 10, 12 bit or higher resolutions.

This content is then mapped to a commanded current for each of the red, green, and blue laser sources such that the output intensity from the lasers is consistent with the input image content. In some embodiments, this process occurs at output pixel rates in excess of 150 MHz. The laser beams are then directed onto scanners 722 and 726. In general, the first scanner 722 provides for one axis of motion (e.g., horizontal), while the second scanner 726 provides for another axis of motion (e.g., vertical). In a typical implementation of such an embodiment, the second scanner 726 is operated to provide the vertical scanning motion at a relatively slow scan rate, while the first scanner 722 is operated to provide horizontal motion at a relatively fast scan rate. This results in the output beam 729 generating a scanning pattern 730.

To provide such a system, the rotation of the second scanner 726 can be operated quasi-statically to create a vertical sawtooth raster trajectory. Conversely, the rotation of the first scanner 722 can be operated on a resonant vibrational mode of the scanner 722 to create sinusoidal motion. Together, this generates both horizontal and vertical motion of the laser beam and results in the pattern 514 of scan lines.

In these embodiments, output beam 729 sweeps back and forth left-to-right in a sinusoidal pattern, and sweeps vertically (top-to-bottom) in a sawtooth pattern with the display blanked during flyback (bottom-to-top). It should be noted that the illustrated scanning pattern 730 shows a sinusoidal pattern as the beam sweeps vertically top-to-bottom, but does not show the flyback from bottom-to-top.

In other embodiments, the vertical sweep is controlled with a triangular wave such that there is no flyback. In still further embodiments, the vertical sweep is sinusoidal. Finally, the various embodiments of the invention are not limited by the waveforms used to control the vertical and horizontal sweep or the resulting raster pattern 730.

It should be noted that in some embodiments, the first scanner 722 and the second scanner 726 both use piezoelectric actuation as described above with reference to FIGS. 1, 2, 3 and 4. However, in other embodiments one more of the scanners can use other techniques, including electrostatic actuation. Furthermore, any number of scanners, mirrors and type of mirror actuation may be employed without departing from the scope of the present invention.

The drive circuits 720 provide drive signals to scanners 722 and 726. The drive signals include excitation signals to control the motion of the scanning mirrors. In operation, the laser light sources produce light pulses for each output pixel and scanners 722 and 726 reflect the light pulses as the output beam 729 traverses the pattern 730. Drive circuits 720 can also receive feedback signals from scanner assemblies 724 and 728. The feedback signals can describe the driven deflection angles of the mirrors and can be used by the drive circuit 720 to more accurately control the motion of the scanners 722 and 726.

For example, the drive circuit 720 can excite resonant motion of scanner 722 such that the peak amplitude of the feedback signal is constant. This provides for a stable maximum angular deflection on the fast-scan axis as shown in raster pattern 730. The excitation signal used to excite resonant motion of scanner 722 can include both amplitude and a phase. Drive circuit 720 includes feedback circuit(s) that modifies the excitation signal amplitude to keep the feedback signal peak amplitude substantially constant. Additionally, the drive circuit 720 can modify the excitation signal to control the horizontal phase alignment and vertical position of the raster pattern 730.

To facilitate this, drive circuit 720 may be implemented in hardware, a programmable processor, or in any combination. For example, in some embodiments, drive circuit 720 is implemented in an application specific integrated circuit (ASIC). Further, in some embodiments, some of the faster data path control is performed in an ASIC and overall control is provided by a software programmable microprocessor.

It should be noted that while FIG. 6 illustrates an embodiment with two drive circuits 720 and two scanners 722 and 726, that this is just one example implementation. As another example, a scanning laser projector could instead be implemented with fewer or more scanners.

Finally, although red, green, blue, and infrared laser light sources are shown in FIG. 6, the various embodiments are not limited to these exemplary wavelengths of laser light.

In the preceding detailed description, reference was made to the accompanying drawings that show, by way of illustration, specific embodiments in which the invention may be practiced. These embodiments were described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The preceding detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. A microelectromechanical systems (MEMS) scanner, comprising:
    a scan plate, the scan plate including a scanning surface;
    a first flexure structure extending from the scan plate;
    a second flexure structure extending from the scan plate;
    a scanner frame surrounding the scan plate, the first flexure structure, and the second flexure structure, wherein the scan plate, the first flexure structure, the second flexure structure and the scanner frame are all formed from a unitary MEMS semiconductor substrate, and wherein the scan plate, the first flexure structure, the second flexure structure and the scanner frame have a thickness between 350 microns and 550 microns; and
    at least one piezoelectric actuator, the at least one piezoelectric actuator formed and separately attached to the scanner frame, wherein the at least one piezoelectric actuator is fabricated from bulk materials in a process separate from the fabrication of the scan plate, the first flexure structure, the second flexure structure and the scanner frame, and wherein the at least one piezoelectric actuator has a thickness between 50 and 150 microns.

2. The MEMS scanner of claim 1, wherein the at least one piezoelectric actuator is attached to the scanner frame with conductive adhesive.

3. The MEMS scanner of claim 1, wherein the at least one piezoelectric actuator is attached to the scanner frame with conductive solder.

4. The MEMS scanner of claim 1, wherein the at least one piezoelectric actuator is a bimorph actuator.

5. The MEMS scanner of claim 1, wherein the at least one piezoelectric actuator is formed from bulk lead zirconate titanate (PZT).

6. The MEMS scanner of claim 1, wherein the at least one piezoelectric actuator is formed from bulk lead magnesium niobate-lead titanate (PMN-PT).

7. The MEMS scanner of claim 1, wherein the unitary MEMS semiconductor substrate comprises a silicon wafer.

8. The MEMS scanner of claim 1, wherein the scan plate, the first flexure structure, the second flexure structure and the scanner frame have a thickness between 350 microns and 550 microns.

9. The MEMS scanner of claim 1, wherein the scan plate, the first flexure structure, the second flexure structure and the scanner frame are patterned from the unitary MEMS semiconductor substrate using etching.

10. The MEMS scanner of claim 1, wherein the scanner frame has a first edge and a second edge, and wherein at least a portion of the first edge and the second edge are defined using etching.

11. The MEMS scanner of claim 1, wherein the scanner frame has a first outer perimeter edge and a second outer perimeter edge opposite the first edge, and wherein the first flexure structure couples to the scanner frame proximate the first outer perimeter edge, and wherein the second flexure structure couples to the scanner frame proximate the second outer perimeter edge, and wherein at least a portion of the first outer perimeter edge and the second outer perimeter edge are defined using etching.

12. The MEMS scanner of claim 1, wherein the at least one piezoelectric actuator comprises at least four actuators.

13. The MEMS scanner of claim 1, wherein the first flexure structure comprises a first torsion arm, and wherein the second flexure structure comprises a second torsion arm.

14. The MEMS scanner of claim 1, further comprising a mirror coupled to the scanning surface.

15. A microelectromechanical systems (MEMS) scanner, comprising:
    a scan plate, the scan plate including a scanning surface;
    a first torsion arm extending from the scan plate;
    a second torsion arm extending from the scan plate;
    a scanner frame surrounding the scan plate, the first torsion arm, and the second torsion arm, wherein the scan plate, the first torsion arm, the second torsion arm and the scanner frame are all formed from a unitary MEMS semiconductor substrate, wherein the scan plate, the first torsion arm, the second torsion arm and the scanner frame are all patterned from the unitary MEMS semiconductor, and wherein the scanner frame has a first outer perimeter edge and a second outer perimeter edge opposite the first edge, and wherein at least a portion of the first outer perimeter edge and the second outer perimeter edge are defined using etching, and wherein the scan plate, the first flexure structure, the second flexure structure and the scanner frame have a thickness between 350 microns and 550 microns; and a set of four piezoelectric actuators, each of the set of four piezoelectric actuators formed from bulk material and separately attached to the scanner frame with conductive material, and wherein each of the set of four piezoelectric actuators have a thickness between 50 and 150 microns.

16. The MEMS scanner of claim 15, wherein the bulk material comprises lead zirconate titanate (PZT).

17. A microelectromechanical systems (MEMS) scanner, comprising:
    a scan plate, the scan plate including a scanning surface;
    a first torsion arm extending from the scan plate;
    a second torsion arm extending from the scan plate;
    a scanner frame surrounding the scan plate, the first torsion arm, and the second torsion arm, wherein the scan plate, the first torsion arm, the second torsion arm and the scanner frame are all formed from a unitary MEMS semiconductor substrate, wherein the scan plate, the first torsion arm, the second torsion arm and the scanner frame have a thickness between 350 microns and 550 microns, wherein the scan plate, the first torsion arm, the second torsion arm and the scanner frame are all patterned from the unitary MEMS semiconductor substrate using etching, and wherein the scanner frame has a first outer perimeter edge and a second outer perimeter edge opposite the first edge, and wherein the first torsion arm couples to the scanner frame proximate the first outer perimeter edge, and wherein the second torsion arm couples to the scanner frame proximate the second outer perimeter edge, and wherein at least a portion of the first outer perimeter edge and the second outer perimeter edge are defined using the etching; and
    a set of four piezoelectric actuators, each of the set of four piezoelectric actuators formed from bulk lead zirconate titanate (PZT) and separately attached to the scanner frame with conductive adhesive, and wherein each of the set of four piezoelectric actuators has a thickness between 50 and 150 microns.

* * * * *